United States Patent [19]

Camplin et al.

[11] 3,916,435

[45] Oct. 28, 1975

[54] HEAT SINK ASSEMBLY FOR BUTTON DIODE RECTIFIERS

[75] Inventors: James E. Camplin; Warren C. Letsinger, both of Kokomo, Ind.

[73] Assignee: General Motors Corporation, Detroit, Mich.

[22] Filed: Sept. 9, 1974

[21] Appl. No.: 504,039

[52] U.S. Cl. ........................ 357/79; 165/80; 357/81

[51] Int. Cl.[2] ........................ H01L 23/42; H01L 23/44; H01L 23/46

[58] Field of Search .................... 357/79, 81; 165/80

[56] References Cited

UNITED STATES PATENTS

| | | | |
|---|---|---|---|
| 3,293,508 | 12/1966 | Boyer | 357/79 |
| 3,474,302 | 10/1969 | Blundell | 357/79 |
| 3,713,007 | 1/1973 | Walter | 357/79 |
| 3,717,523 | 2/1973 | Dunsche | 357/79 |
| 3,743,896 | 7/1973 | Weiske et al. | 357/79 |
| 3,753,052 | 8/1973 | Rosser | 357/79 |
| 3,808,471 | 4/1974 | Grandia | 357/79 |

FOREIGN PATENTS OR APPLICATIONS

| | | | |
|---|---|---|---|
| 17,936 | 6/1969 | Japan | 357/79 |

*Primary Examiner*—Andrew J. James
*Attorney, Agent, or Firm*—Robert J. Wallace

[57] ABSTRACT

A heat sink assembly for a power semiconductor button-type diode which is easily assembled without requiring any soldered connections. An extruded heat sink has at least two spaced parallel convector fins extending transversely from a base member. Each of the fins has a shoulder portion which faces the other fin and extends parallel to the base member. A rectangular spring member has a plurality of teeth extending from its opposite side. The teeth engage the side walls of the fins directly underneath the shoulder portions to prevent horizontal and vertical movement of the spring member. The spring member presses an electrically conductive terminal against one contact of the button diode to provide thermal and electrical connection between the button diode and the heat sink.

2 Claims, 5 Drawing Figures

HEAT SINK ASSEMBLY FOR BUTTON DIODE RECTIFIERS

BACKGROUND OF THE INVENTION

This invention relates to heat sink assemblies for semiconductor devices. More particularly, it relates to a heat sink assembly especially adapted for rectification applications using button-type diodes, wherein the apparatus is easily assembled without requiring any soldered connections.

Button diodes have recently been gaining wide acceptance in a variety of commercial applications. Briefly, button diodes have a disc-like construction with a plastic body and two electrical contacts extending from its opposite major faces. One such application for these button diodes is for rectification of the current supplied by an alternator in an automotive electrical system. It is generally accepted that these power button diodes must be thermally connected to a heat sink in order to readily dissipate heat generated within the diodes. It has been suggested that the button diodes be soldered to the heat sink assembly. In fact, until now it has been the only practical method by which both electrical and thermal connection could be made between the button diode and the heat sink. However, such an assembly inherently has its disadvantages. For example, there must be some sort of heat source in order to carry out the soldering operation. While such heat sources, such as a soldering iron, are readily available during manufacture of the assembly in the plant, they may not be so readily available or convenient to use for repair. Furthermore, once a plurality of button diodes have been soldered to a heat sink, they are not readily individually replaceable. Moreover, heat sink-button diode assemblies tend to be relatively complex. Accordingly, these heat sink assemblies are relatively expensive to manufacture and service in the field.

OBJECTS AND SUMMARY OF THE INVENTION

Therefore, it is an object of this invention to provide a heat sink assembly for a button diode that is inexpensive to manufacture and service in the field.

It is a further object of this invention to provide a heat sink assembly for button diode rectification applications, wherein the package can be assembled using basic tools without requiring any soldered connection.

It is another object of this invention to provide a heat sink assembly for power button diodes that can be used in a wide variety of commercial rectification applications, wherein faulty button diodes can be easily replaced with a minimum of time and effort.

In brief, the present invention has a heat sink with at least two spaced parallel convector fins extending from a major face of a base member for the heat sink. The heat sink is a unitary body of extruded lightweight aluminum. Two adjacent convector fins each include shoulder portions which inwardly face one another and extend parallel to the base member. A rectangular spring member has a plurality of teeth extending from its opposite sides. The teeth engage the side walls of each of the fins directly underneath the shoulders to prevent lateral movement of the spring. Analogously, the shoulder portion of the fins prevent movement of the spring member perpendicularly away from the face of the base member. The spring member presses an electrically conductive terminal against one contact on the button diode. This consequently presses the other contact of the button diode into receiving means on the base member of the heat sink. Preferably, the teeth subtend at an angle of 60° and extend approximately 5 mils into the side walls of the convector fins.

DESCRIPTION OF THE PREFERRED EMBODIMENT

Figures 1, 2, 3, 4, 5:
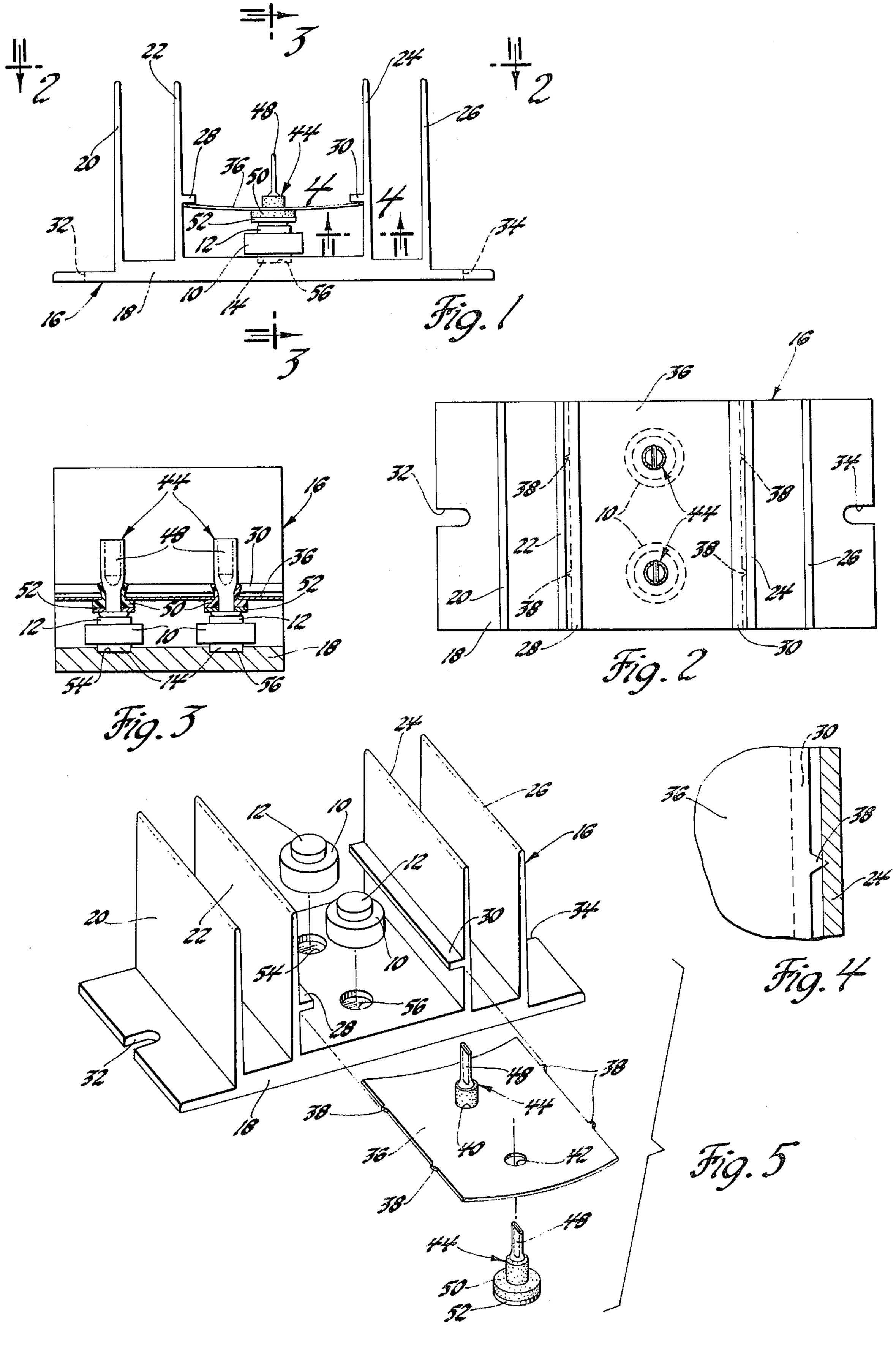
FIG. 1 is a front elevational view of one embodiment of the present invention.
FIG. 2 shows a top plan view along the line 2—2 of FIG. 1.
FIG. 3 shows a sectional view along the line 3—3 of FIG. 1.
FIG. 4 shows an enlarged partial sectional view along the line 4—4 of FIG. 1.
FIG. 5 shows an exploded isometric view of the embodiment shown in FIG. 1.

Referring now to the drawings, two button diodes 10 each include two electrical contacts 12 and 14 extending from its major surfaces. Button diodes 10 consist of a silicon wafer having two major faces being separated by a PN junction. Two nickel plated copper slugs serving as contacts 12 and 14 are soldered to the opposite faces of the silicon wafer. An epoxy plastic body is molded around the silicon wafer and the contacts, except for outer surfaces of the contacts which are exposed to provide electrical access to the wafer.

A heat sink is generally designated by the numeral 16. Heat sink 16 is a unitary body made of a lightweight extruded aluminum alloy. The heat sink 16 includes a horizontally extending base member 18. Four convector fins 20, 22, 24 and 26 extend vertically from a major face defined by the top surface of base member 18. Fins 22 and 24 are spaced approximately 1.2 inches apart. In this preferred embodiment, fins 20, 22, 24 and 26 have a height of about 1.3 inches extending from base member 18. The width of the fins 20, 22, 24 and 26, as well as base member 18, is about 1½ inches. The fins 20, 22, 24 and 26 provide a high surface area for heat sink 16 so that it readily dissipates heat created in button diodes 10.

Adjacent fins 22 and 24 each include an integral ridge which serve as shoulder portions 28 and 30 respectively. Shoulder portions 28 and 30 are approximately 0.35 inch above base member 18 and project approximately 0.10 inch away from the side walls of their respective fins. As can be seen in the drawings, shoulder portions 28 and 30 extend throughout the width of their respective fins 22 and 24 parallel to base member 18, and each shoulder portion faces inwardly toward each other. Indentations 32 and 34 on opposite ends of base member 18 facilitate mounting the heat sink.

Special attention is now drawn to spring member 36 which can be seen most clearly in FIG. 5. Spring member 36 is generally rectangular. In its unbiased state as seen in FIG. 5, spring member 36 is bowed. Spring member 36 can be visualized as an arc of a circle having a radius of about 3.2 inches, with a chord of about 1.2 inches defining the length of the spring member 36. Spring member 36 has the same width as base member 18 and fins 20, 22, 24 and 26. Preferably, spring member 36 is constructed of annealed spring steel, SAE number 1095, which has been plated with cadmium. Preferably, it takes approximately 20 pounds of pressure to flatten spring member 36 against a flat surface.

Emphasis is now drawn to teeth 38 which extend from opposite sides of spring member 36. There are two teeth on each side of spring member 36. Each of the teeth 38 subtend at an angle of approximately 60° and extend about 0.04 inch from the sides of spring member 36. The teeth 38 on each side of spring member 36 are spaced approximately ¾ inches from each other.

Two holes 40 and 42 provide openings through which terminal assemblies 44 extend. Each terminal assembly 44 consists of an electrically conductive eyelet 48 having a crimped upper end portion and a flat lower portion for abutting contact 12 of button diode 12 as can be seen in FIG. 3. Preferably, eyelet 48 is copper having a nickel plated finish. Eyelet 48 can be Stock No. A-1014 distributed by Stimson Company, Inc. A nylon bushing 50 is press fit into openings 40 and 42 of spring member 36 to hold eyelet 48 therein and to insulate it from spring member 36. A washer 52 is provided between bushing 50 and the lower portion of eyelet 48.

Referring now especially to FIG. 5, the assembly of this embodiment of the present invention will now be described. Terminal assemblies 44 are inserted one each into holes 40 and 42 in spring member 36. Preferably, a drop of thermal joint compound is applied to the bottom surface of eyelet 48 and to recesses 54 and 56 in base member 18. Recesses 54 and 56 are generally circular in diameter with a depth slightly less than that of contact 14 for button diode 10. The thermal joint compound (not shown) is a conductive liquid which aids in providing good thermal and electrical connection to the diode contacts 12 and 14. For example, thermal joint compound can be that marketed under the trade name Thermocoat distributed by Thermoalloy Company of Dallas, Texas. Spring member 36 is then slipped underneath the two opposing shoulder portions 28 and 30 until eyelets 48 are aligned with their corresponding recesses 54 and 56. Spring member 36 is then pried upwardly, for example with a screwdriver, so that the teeth 38 partially puncture or engage the side walls of fins 22 and 24 as shown in FIG. 4. The construction of teeth 38 is such that each will extend approximately 5 mils into the side walls of the fins. We have discovered that such an engagement will secure spring member 36 to the heat sink and prevent horizontal movement thereof.

While spring member 36 is being pried upwardly, the two button diodes 10 are inserted into recesses 54 and 56, respectively, for example with the use of long nosed pliers. When the spring member 36 is released, the bottom surface of both eyelets 48 contact button diode contacts 12, as can be seen in FIGS. 1 and 3. Spring member 36 supplies a downward force to terminal assemblies 44 so as to press button diode contacts 14 against the bottom surfaces of recesses 54 and 56. Shoulder portions 28 and 30 provide support for the opposite sides of the spring member 36 and prevent vertical movement thereof, perpendicularly away from the major face of base member 18.

The heat sink assembly package as shown in this preferred embodiment can be readily used as a full wave rectifier. In such an application, an electrically conductive terminal (not shown) can be connected to base member 18 to provide electrical connection to the output load. If required, insulating spacers may be slipped onto indentations 32 and 34 to electrically insulate the heat sink. Commercially available electrical connectors can be slipped onto the upper end of eyelets 48 to provide electrical connection to external circuitry. It should also be noted that two of the heat sink assemblies as just described can be readily connected for use as a full wave bridge rectifier.

As just described, the heat sink assembly package consists of relatively few, inexpensive parts, yet it provides excellent electrical connection and heat dissipation. Furthermore, the assembly of our heat sink assembly requires no soldered connections and can be easily assembled with but a few simple tools. Our invention further provides a package which is useful in a wide variety of rectification applications. Furthermore, the polarity of the button diodes can be easily reversed or faulty diodes replaced very easily. One need only pry up spring member 36 so that the terminal assembly no longer press against the bottom diode, and then slide the diode out of the heat sink assembly to reverse its polarity or replace it, as required.

What we claim as new and desire to secure Letters Patent of the United States is:

1. A heat sink assembly for a power semiconductor button diode which is easily assembled without requiring any soldered connection, said package comprising:

a unitary body serving as a heat sink, said heat sink having a base member with a major face, at least two spaced parallel convector fins extending transversely from said base member face, said fins having a substantial height and length so as to provide a large surface area for said heat sink, two adjacent fins having complementary facing integral ridges extending parallel to said base member face and defining shoulders substantially in a common plane, said base member having conformations between said two fins adapted to seat against one electrical contact of at least one button diode in electrical and heat conducting relationship, a rectangular spring member having a plurality of teeth extending from opposite sides thereof and adapted when flexed to fit against said adjacent fins, said teeth engaging said adjacent fins directly underneath said shoulder portion thereby preventing movement of said spring member laterally along said shoulders, said shoulders seating against said spring member to hold the same against movement away from said base member face, an opening in said spring member in register with said base member conformations, a terminal in said opening and insulated from said spring member for making electrical connection to the other electrical contact on said button diode, the flexing of said spring member being in a direction to press said terminal against said button diode other electrical contact whereby external electrical connection is made to said button diode without any soldered connection, so as to facilitate easy assembly and replacement of said button diode.

2. An easily assembled and economical button diode-heat sink assembly for rectification applications requiring no soldered connections and permitting easy diode replacement, said assembly comprising:

an extruded aluminum unitary body serving as a heat sink, a base portion on said heat sink with a major face having a transverse dimension, at least two spaced parallel convector fins extending transversely across and projecting generally perpendicularly from said base member face, said fins having a length generally equal to the transverse dimension of said face and a substantial height that provides facing major surfaces on said fins and a large surface area for said heat sink, complementary facing integral ridges on said facing fin surfaces, said ridges providing shoulders on said fins in a common plane generally parallel to said base member face, each of said ridges extending along substantially the entire length of said fins, two recesses in said base member face between said fins for receiving a pair of button diodes in electrical and heat conducting relationship with electrodes thereof, said recesses generally equally spaced from said fins and mutually spaced from each other generally parallel to said fins, a rectangular sheetlike spring member between said fins and extending transversely across most of said base member face, an arcuate set in said spring member between opposite edges thereof curving away from said base member face, said opposite parallel edges on said spring member engaging said fin shoulders and preventing said spring member from moving perpendicularly away from said base member face, a plurality of teeth extending outwardly several mils from said spring member opposite side, said teeth subtending an angle of about 60° and engaging said facing fin surfaces to prevent transverse movement of said spring member parallel to said base member face, two openings in said spring member complementary to said two base member recesses, an elongated terminal member in each of said openings and electrically insulated from said spring member, a conformation on one end of each terminal member for retaining it in said opening when contacting a button diode, the other end of each terminal member having a conformation for receiving a terminal connector, a pair of button diodes between said spring member and said base member, one electrode of one button diode seated in each of said recesses and making an electrical connection with said base member, an opposite contact of each of said button diodes registered with its respective terminal member, and the permanent arcuate set in said spring member urging each of said terminal members against its respective button diode opposite contact, whereby diode seating in said recesses and electrical connections to said button diode electrodes is maintained without soldered connections, and diodes can be easily replaced.

* * * * *